United States Patent [19]
Daidai et al.

[11] Patent Number: 5,593,721
[45] Date of Patent: Jan. 14, 1997

[54] METHOD FOR MANUFACTURING A PIEZOELECTRIC RESONANT COMPONENT

[75] Inventors: Muneyuki Daidai; Manabu Sumita, both of Toyama, Japan

[73] Assignee: Murata Manufacturing Co., Ltd., Nagaokakyo, Japan

[21] Appl. No.: 457,141

[22] Filed: Jun. 1, 1995

[30] Foreign Application Priority Data

Jul. 26, 1994 [JP] Japan ................... 6-194973
Aug. 15, 1994 [JP] Japan ................... 6-214276
Apr. 13, 1995 [JP] Japan ................... 7-113587

[51] Int. Cl.$^6$ ................... B05D 5/12; H04R 17/00
[52] U.S. Cl. ................... 427/100; 29/25.35; 310/340; 252/62.9; 174/52.1; 174/52.2; 361/225; 361/226; 257/787; 257/790; 257/791
[58] Field of Search ................... 427/100; 252/62.9; 29/25.35; 310/340; 257/787–791; 174/52.1–52.3; 361/225, 226

[56] References Cited

U.S. PATENT DOCUMENTS

| | | | |
|---|---|---|---|
| 3,650,003 | 3/1972 | Toyoshima | 29/25.35 |
| 3,747,176 | 7/1973 | Toyoshima | 310/340 |
| 4,017,752 | 4/1977 | Kakehi et al. | 310/340 |
| 4,103,264 | 7/1978 | Howatt et al. | 310/340 |
| 5,184,043 | 2/1993 | Yoshinaga | 29/25.35 |

FOREIGN PATENT DOCUMENTS

| | | | |
|---|---|---|---|
| 0003201 | 1/1980 | Japan | 29/25.35 |
| 0042415 | 4/1981 | Japan | 29/25.35 |
| 0288506 | 12/1986 | Japan | 310/340 |
| 0049411 | 2/1989 | Japan | 310/340 |
| 0087812 | 3/1990 | Japan | 310/340 |
| 0309807 | 12/1990 | Japan | 310/340 |
| 0006910 | 1/1991 | Japan | 310/340 |
| 5218776 | 8/1993 | Japan | 29/25.35 |

*Primary Examiner*—Shrive Beck
*Assistant Examiner*—Brian K. Talbot
*Attorney, Agent, or Firm*—Burns, Doane, Swecker & Mathis, LLP

[57] ABSTRACT

An organic silicon compound 10 is applied around vibrating electrodes 3a and 3b of a piezoelectric resonant element 1. A compound such as silane, chlorosilane, silazane, silthiane, siloxane, cyclosilane, cyclosilazane, cyclosilthiane, cyclosiloxane, silanol, or metallosilicone is used as the organic silicon compound 10. Around the piezoelectric resonant element 1 and the organic silicon compound 10, for example, an ultraviolet ray curing resin is applied, and the ultraviolet ray curing resin is cured, thereby a permeable film 11 is formed. A cavity 12 is formed around the vibrating electrodes 3a and 3b by dispersing the organic silicon compound 10 to the outside through the film 11. Around the film 11, for example, an outer coating resin is applied, and the outer coating resin is cured, thereby an outer coating material 13 is formed.

5 Claims, 3 Drawing Sheets

METHOD FOR MANUFACTURING A PIEZOELECTRIC RESONANT COMPONENT

BACKGROUND OF THE INVENTION

1. Field of the Invention

The present invention relates to a method for manufacturing a piezoelectric resonant component, more particularly, to a method for manufacturing a piezoelectric resonant component having a cavity formed around a vibrating electrode of a piezoelectric resonant element.

2. Description of the Prior Art

FIG. 2 is a plan view showing an example of a conventional piezoelectric resonant element which is a background of the present invention and to which the present invention is applied. The piezoelectric resonant element 1 includes, for example, a rectangular piezoelectric substrate 2 made of ceramic or the like. At the center of one main surface of the piezoelectric substrate 2 and at the center of the other main surface thereof, for example, circular vibrating electrodes 3a and 3b are respectively formed in such a manner that the vibrating electrodes 3a and 3b are opposed to each other and the piezoelectric substrate 2 is sandwiched therebetween. A drawing electrode 4a is formed so as to extend from one end of the main surface of the piezoelectric substrate 2 to the vibrating electrode 3a, while a drawing electrode 4b is formed so as to extend from the other end of the other main surface thereof to the vibrating electrode 3b. To each of the drawing electrodes 4a and 4b, for example, one end of each of long lead terminals 5a and 5b is soldered.

FIGS. 3(A)–3(C) are sectional illustrative views showing an example of a conventional method for manufacturing a piezoelectric resonant component using the piezoelectric resonant element shown in FIG. 2. In the conventional method, first, as shown in FIG. 3(A), wax 6 such as paraffin wax, micro-crystalline wax or the like is dripped around the vibrating electrodes 3a and 3b of the piezoelectric resonant element 1.

Then, as shown in FIG. 3(B), an outer coating resin 7 is applied around the piezoelectric resonant element 1 and the wax 6. The outer coating resin 7 is made of a thermosetting resin, a solvent having a low boiling point, and a filler mixed with each other.

Then, the wax 6 positioned around the vibrating electrodes 3a and 3b is dispersed to the outside, and the outer coating resin 7 is cured. As a result, as shown in FIG. 3(C), a cavity 8 is formed around the vibrating electrodes 3a and 3b, and an outer coating material 9 is formed around the piezoelectric resonant element 1 and the cavity 8. In this case, first, the outer coating resin 7 is dried at a low temperature, thereby the solvent contained in the outer coating resin 7 is dispered to the outside. As a result, pores are formed on paths of the outer coating resin 7 through which the solvent is dispersed. Then, the whole is heated to cure the outer coating resin 7. When heating, the wax 6 is absorbed into the pores of the outer coating resin 7 and dispersed to the outside, thereby the cavity 8 is formed around the vibrating electrodes 3a and 3b. As a result of the heating of the whole, the outer coating resin 7 is cured, the outer coating material 9 is formed around the piezoelectric resonant element 1 and the cavity 8, and the wax 6 absorbed into the outer coating resin 7 is dispersed to the outside. Thus, in the conventional method shown in FIGS. 3(A)–3(C), the piezoelectric resonant component having the cavity 8 formed in the outer coating material 9 around the vibrating electrodes 3a and 3b of the piezoelectric resonant element 1 is manufactured.

However, in the conventional method shown in FIGS. 3(A)–3(C), since the pores are formed in the outer coating resin 7 by dispersing the solvent contained in the outer coating resin 7 to the outside, it is necessary to dry the outer coating resin 7 sufficiently. Thus, the conventional method is low in productivity.

Also, in the conventional method shown in FIGS. 3(A)–3(C), when the outer coating resin 7 is dried, since much flammable solvent is dispersed to the outside, there is a danger from fire.

Furthermore, in the conventional method shown in FIGS. 3(A)–3(C), there is a possibility that the pores are not formed sufficiently in the outer coating resin 7. In this case, the wax 6 remains around the vibrating electrodes 3a and 3b. Even though the pores are formed sufficiently in the outer coating resin 7, there is a possibility that the wax 6 is not absorbed into the pores and remains around the vibrating electrodes 3a and 3b. When the wax 6 has remained around the vibrating electrodes 3a and 3b, the characteristic of the piezoelectric resonant component is deteriorated.

Moreover, in the piezoelectric resonant component manufactured by the conventional method shown in FIGS. 3(A)–3(C), when the piezoelectric resonant component is washed with water, since the outer coating material 9 is porous, there is a possibility that water penetrates into the cavity 8 through the outer coating material 9. Since the diameters of pores of the outer coating material 9 communicating with the cavity 8 are small, it is difficult for the water which has penetrated into the cavity 8 to leave the cavity 8. Thus, the piezoelectric resonant component has a low water-resistant performance.

SUMMARY OF THE INVENTION

Therefore, it is a primary object of the present invention to provide a method for manufacturing a piezoelectric resonant component, highly productive and safe, capable of forming a cavity reliably around a vibrating electrode, and capable of manufacturing a piezoelectric resonant component having a high water-resistant performance.

The present invention is a method for manufacturing a piezoelectric resonant component having a cavity formed around a vibrating electrode of a piezoelectric resonant element comprising the step of applying an organic silicon compound around the vibrating electrode of the piezoelectric resonant element, the step of forming a film around the piezoelectric resonant element and the organic silicon compound, the step of forming the cavity by dispersing the organic silicon compound to the outside through the film, and the step of forming an outer coating material around the film.

In the present invention, the step of applying the organic silicon compound includes, for example, the step of applying at least one compound of silane, chlorosilane, silazane, silthiane, siloxane, cyclosilane, cyclosilazane, cyclosilthiane, cyclosiloxane, silanol, and metallosilicone around the vibrating electrode.

In the present invention, the step of forming the film includes, for example, the step of applying an ultraviolet ray curing resin around the piezoelectric resonant element and the organic silicon compound, and the step of curing the ultraviolet ray curing resin.

In the present invention, the step of forming the cavity includes, for example, the step of volatilizing the organic silicon compound.

In the present invention, the step of forming the outer coating material includes, for example, the step of applying an outer coating resin around the film, and the step of curing the outer coating resin.

In the present invention, the organic silicon compound is applied around the vibrating electrode of the piezoelectric resonant element, the film is formed around the piezoelectric resonant element and the organic silicon compound, and the organic silicon compound is dispersed to the outside through the film, thereby the cavity is formed around vibrating electrode.

Furthermore, in the present invention, the outer coating resin is formed around the film.

In the method for manufacturing the piezoelectric resonant component according to the present invention, in order to form the cavity around the vibrating electrode, since it is unnecessary that pores are formed in the outer coating material and an outer coating resin as the outer coating material is sufficiently dried, there is a high productivity.

Also, in the method for manufacturing the piezoelectric resonant component according to the present invention, since much flammable solvent is not dispersed to the outside, these is little danger from fire.

Furthermore, in the method for manufacturing the piezoelectric resonant component according to the present invention, since the cavity is formed around the vibrating electrode by dispersing the organic silicon compound to the outside through the film, the organic silicon compound hardly remains around the vibrating electrode, and the cavity can be reliably formed around the vibrating electrode. Thus, the characteristic of the piezoelectric resonant component is hardly deteriorated.

Also, in the piezoelectric resonant component manufactured by the method for manufacturing the piezoelectric resonant component according to the present invention, since the outer coating material is not porous, there is a high water-resistant performance.

According to the present-invention, it can obtain a method for manufacturing a piezoelectric resonant component, highly productive and safe, capable of forming a cavity reliably around a vibrating electrode, and capable of manufacturing a piezoelectric resonant component having a high water-resistant performance.

The above and other objects, features, aspects and advantages of the present invention will become more apparent from the following detailed description of the embodiments with reference to the accompanying drawings.

DESCRIPTION OF THE PREFERRED EMBODIMENTS

Figure 1A:
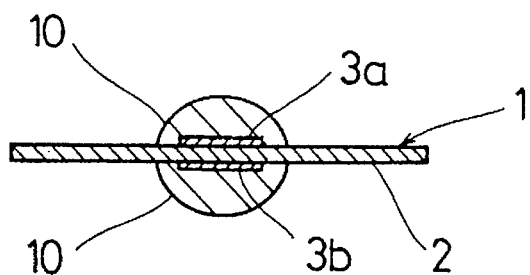
FIGS. 1(A), 1(B), 1(C), and 1(D) are sectional illustrative views showing an embodiment of the present invention.
Figure 1B:
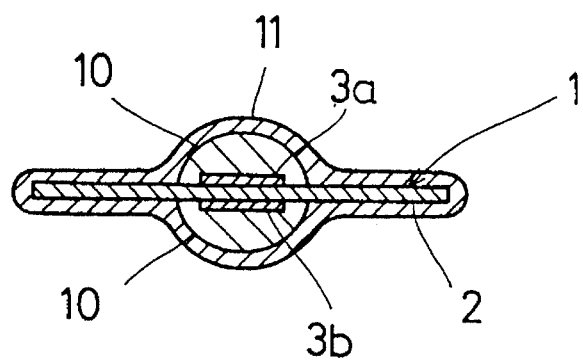
Figure 1C:
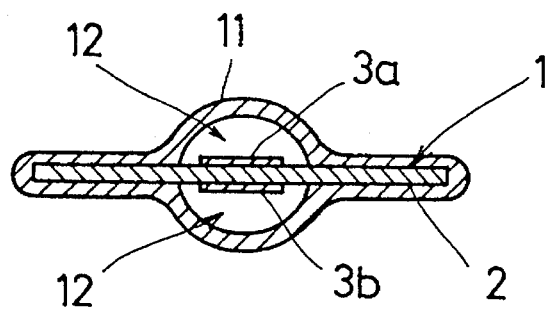
Figure 1D:
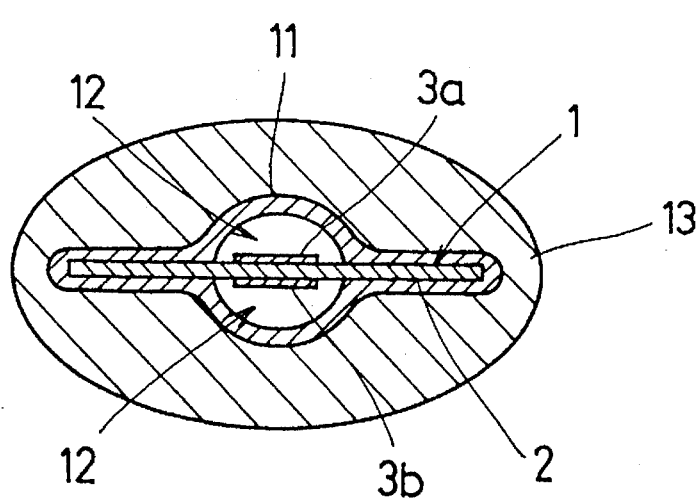
Figure 2:
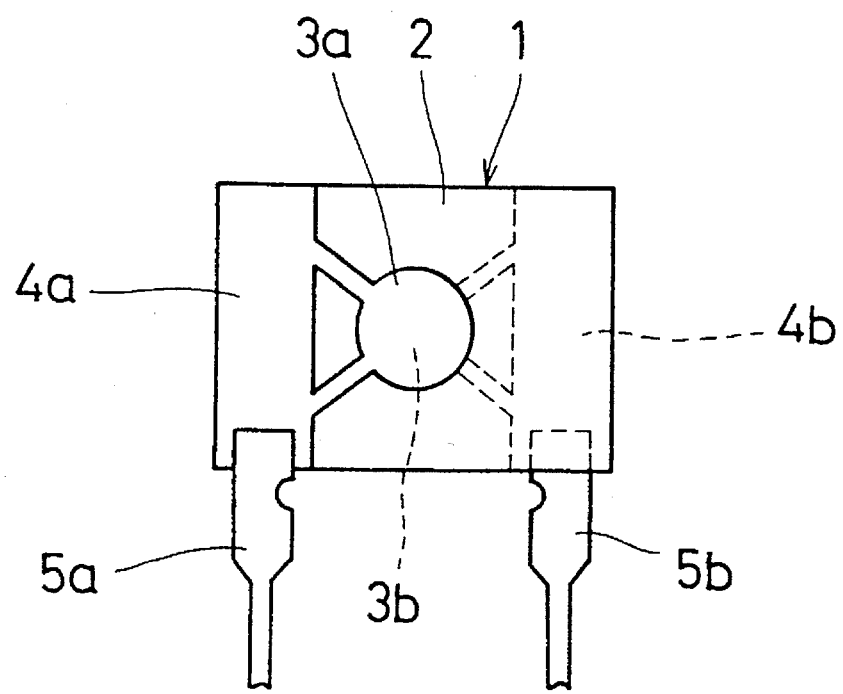
FIG. 2 is a plan view showing an example of a conventional piezoelectric resonant element which is a background of the present invention and to which the present invention is applied.
Figure 3A:
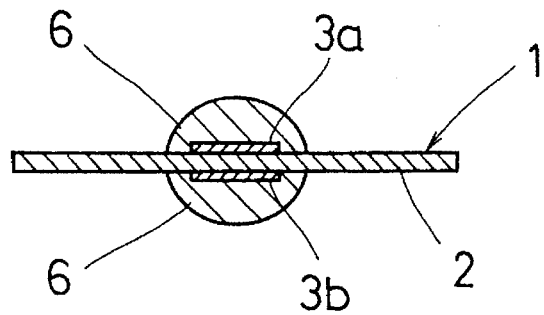
FIGS. 3(A), 3(B), and 3(C) are sectional illustrative views showing an example of a conventional method for manufacturing a piezoelectric resonant component.
Figure 3B:
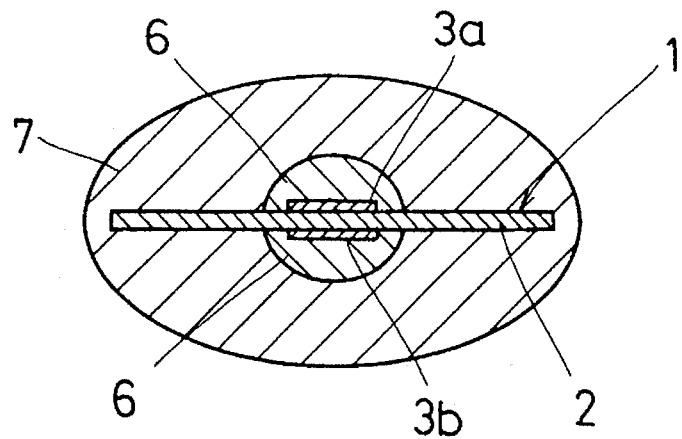
Figure 3C:
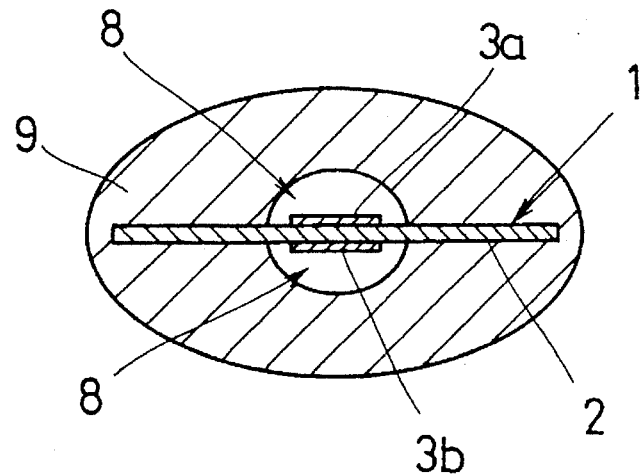

FIGS. 1(A)–1(D) are sectional illustrative views showing an embodiment of the present invention for manufacturing a piezoelectric resonant component by using the piezoelectric resonant element 1 shown in FIG. 2. In the embodiment, first, as shown in FIG. 1(A), an organic silicon compound 10 is applied around the vibrating electrodes 3a and 3b of the piezoelectric resonant element 1. In this embodiment, hexamethylcyclotrisiloxane, having the following structural formula, the melting point of 62° C. and the boiling point of 134° C., is used as the organic silicon compound 10.

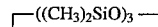

At least one compound of silane, chlorosilane, silazane, silthiane, siloxane, cyclosilane, cyclosilazane, cyclosilthiane, cyclosiloxane, silanol, and metallosilicone is used as the organic silicon compound 10. It is necessary that the organic silicon compound 10 has the melting point more than 25° C. and is solid at the room temperature. It is also necessary that the organic silicon compound 10 is vaporized at a temperature at which the characteristic of the piezoelectric resonant element 1 made of piezoelectric ceramic does not deteriorate. It is preferable that the organic silicon compound 10 has the boiling point lower than 180° C., is chemically stable and is not poisonous.

Then, as shown in FIG. 1(B), a permeable film 11 is formed around the piezoelectric resonant element 1 and the organic silicon compound 10. In this case, for example, an ultraviolet ray curing resin is applied around the piezoelectric resonant element 1 and the organic silicon compound 10, and the ultraviolet ray curing resin is cured by irradiating ultraviolet rays to the ultraviolet ray curing resin, thereby the film 11 is formed. The material of the film 11 to be used in the embodiment is a substance which is cured at a temperature lower than the melting point of the organic silicon compound 10 and which does not melt the organic silicon compound 10. The permeability of the film 11 can be increased by using polymer having a low cross linking density in its molecular structure, filler by dispersing it in the material of the film 11 to permeate air via the interface between the filler and the polymer, porous or acicular filler by dispersing it in the material of the film 11, and a substance such as an ultraviolet ray curing silicone having a low surface tension.

Then, the organic silicon compound 10 is dispersed to the outside through the film 11, thereby a cavity 12 is formed around the vibrating electrodes 3a and 3b, as shown in FIG. 1(C). In this case, the organic silicon compound 10 is heated at a temperature higher than the boiling point thereof to volatilize it. In this manner, the organic silicon compound 10 is dispersed to the outside. At this time, the organic silicon compound 10 passes through the film 11 in the form of vapor. If the film 11 is not permeable, the organic silicon compound 10 may be dispersed to the outside through the interface between the film 11 and the piezoelectric resonant element 1 or through the interface between the film 11 and lead terminals 5a and 5b.

As shown in FIG. 1(D), an outer coating material 13 is formed around the film 11. In this case, a thermosetting resin such as liquid epoxy resin is dipped as an outer coating resin around the film 11, and the thermosetting resin is heated to cure it, thereby the outer coating material 13 is formed. In addition to dipping method, the outer coating resin can be applied by using a dispenser, by casting painting or by pulverization painting.

Thus, in the embodiment shown in FIGS. 1(A)–1(D), the piezoelectric resonant component having the cavity 12 formed around the vibrating electrodes 3a and 3b of the piezoelectric resonant element 1 is manufactured.

In the embodiment shown in FIGS. 1(A)–1(D), in order to form the cavity 12 around the vibrating electrodes 3a and 3b, since it is unnecessary that pores are formed in the outer coating material 13 and the outer coating resin as the outer coating material 13 is sufficiently dried, there is a high productivity.

Also, in the embodiment shown in FIGS. 1(A)–1(D), since much flammable solvent is not dispersed to the outside, there is little danger from fire.

Furthermore, in the embodiment shown in FIGS. 1(A)–1(D), the cavity 12 is formed around the vibrating electrodes 3a and 3b by dispersing the organic silicon compound 10 to the outside through the permeable film 11, the organic silicon compound 10 hardly remains around the vibrating electrodes 3a and 3b, and the cavity 12 can be reliably formed around the vibrating electrodes 3a and 3b. Thus, the characteristic of the piezoelectric resonant component is hardly deteriorated.

Also, in the piezoelectric resonant component manufactured by the method according to the embodiment shown in FIGS. 1(A)–1(D), since the outer coating material 13 is not porous, there is a high water-resistant performance.

Although the lead terminals 5a and 5b are not shown in FIGS. 1(A)–1(D), ends of lead terminals 5a and 5b connected with the piezoelectric resonant element 1 are covered with the film 11 and the outer coating material 13.

In the above-mentioned embodiment, an example of the method for manufacturing the piezoelectric resonant component having two lead terminals has been described, but the method according to the present invention is applicable to a piezoelectric resonant component having three or more lead terminals.

It will be apparent from the foregoing that, while the present invention has been described in detail and illustrated, these are only particular illustrations and examples, and the present invention is not limited to these.

What is claimed is:

1. A method for manufacturing a piezoelectric resonant component having a cavity formed around a vibrating electrode of a piezoelectric resonant element comprising the steps of:

applying an organic silicon compound around said vibrating electrode of said piezoelectric resonant element;

forming a film around said piezoelectric resonant element and said organic silicon compound;

forming said cavity by dispersing said organic silicon compound to the outside through said film; and forming an outer coating material around said film.

2. A method for manufacturing a piezoelectric resonant component according to claim 1, wherein the step of applying said organic silicon compound includes the step of:

applying at least one compound selected from the group consisting of silane, chlorosilane, silazane, silthiane, siloxane, cyclosilane, cyclosilazane, cyclosilthiane, cyclosiloxane, silanol, and metallosilicone.

3. A method for manufacturing a piezoelectric resonant component according to claim 1, wherein the step of forming said film includes the steps of:

applying an ultraviolet ray curing resin around said piezoelectric resonant element and said organic silicon compound; and curing said ultraviolet ray curing resin.

4. A method for manufacturing a piezoelectric resonant component according to claim 1, wherein the step of forming said cavity includes the step of:

volatilizing said organic silicon compound.

5. A method for manufacturing a piezoelectric resonant component according to claim 1, wherein the step of forming said outer coating material includes the steps of:

applying an outer coating resin around said film; and curing said outer coating resin.

* * * * *